(12) United States Patent
Fan et al.

(10) Patent No.: US 6,713,821 B2
(45) Date of Patent: Mar. 30, 2004

(54) STRUCTURE OF A MASK ROM DEVICE

(75) Inventors: Tso-Hung Fan, Taipei Hsien (TW);
Mu-Yi Liu, Taichung (TW);
Kwang-Yang Chan, Hsinchu (TW);
Yen-Hung Yeh, Taoyuan Hsien (TW);
Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/155,619

(22) Filed: May 24, 2002

(65) Prior Publication Data
US 2003/0201501 A1 Oct. 30, 2003

(30) Foreign Application Priority Data
Apr. 26, 2002 (TW) ........................................ 91108649 A

(51) Int. Cl.[7] ............................................ H01L 31/062
(52) U.S. Cl. ..................... 257/390; 438/275; 438/276; 438/277; 438/278
(58) Field of Search ........................... 257/390; 438/128, 438/129, 130, 275–290

(56) References Cited

U.S. PATENT DOCUMENTS

| | | | |
|---|---|---|---|
| 6,207,999 B1 * | 3/2001 | Wu | 257/390 |
| 6,380,584 B1 * | 4/2002 | Ogawa | 257/315 |
| 6,440,803 B1 * | 8/2002 | Huang et al. | 438/276 |
| 6,482,702 B1 * | 11/2002 | Yu et al. | 438/278 |
| 6,512,276 B1 * | 1/2003 | Tanaka | 257/390 |

* cited by examiner

Primary Examiner—David Nelms
Assistant Examiner—Andy Huynh
(74) Attorney, Agent, or Firm—J.C. Patents

(57) ABSTRACT

A mask ROM device is described. The mask ROM device includes a substrate, a gate, a double diffused source/drain region that comprises a first doped region and a second doped region, a channel region, a coding region, a dielectric layer and a word line. The gate is disposed on the substrate. The double diffused source/drain region is positioned beside the sides of the gate in the substrate, wherein the second doped region is located at the periphery of the first doped region in the substrate. The channel region is located between the double diffused source/drain region in the substrate. The coding region is disposed in the substrate at the intersection between the sides of the channel region and the double diffused source/drain region. The dielectric layer is disposed above the double diffused source/drain region, while the word line is disposed above the dielectric layer and the gate.

9 Claims, 6 Drawing Sheets

STRUCTURE OF A MASK ROM DEVICE

CROSS-REFERENCE TO RELATED APPLICATION

This application claims the priority benefit of Taiwan application serial no. 91108649, filed Apr. 26, 2002.

BACKGROUND OF THE INVENTION

1. Field of the Invention

The present invention relates to a memory device. More particularly, the present invention relates to a structure of a mask read-only memory (ROM) device.

2. Background of the Invention

Mask ROM device comprises the non-volatile characteristics in which memory is retained even the electrical power source is being interrupted. Therefore, this type of memory device is included in many electronic products to maintain a normal operation of "on" and "off" for these electronic products. The mask ROM device is the most fundamental type of read-only memory device. A typical mask ROM device uses a channel transistor as the memory cell. To program a typical mask ROM device is accomplished by selectively implanting dopants to the channel region. The "on" and "off" of the memory cell is thus achieved by altering the threshold voltage.

A typical mask ROM device provides a polysilicon word line (WL) crossing over the bit line (BL). The region locates below the word line and between the bit lines serves as the channel region of the memory device. For this type of manufacturing, the storage of the binary digit "0" or "1" is determined by whether the channel is implanted with dopants. The implantation of dopants to the specified channel region is known as code implantation.

In a conventional mask ROM memory, each memory cell can only store one bit of information. As the increase of the storage capacity of a mask ROM device is being demanded, the field effect transistor that is required for the mask ROM device increases correspondingly. As a result, miniaturizing devices and further increasing the integration of devices can not be accomplished. Moreover, the miniaturization of device to improve the integration of devices is impeded by the slow advancement in manufacturing techniques.

Due to the above problem, it has been proposed to perform the code implantation at both ends of the channel of a memory cell to increase the integration of the device by means of the 1 cell 2 bit method. This 1 cell 2 bit type of storage method requires an implantation of a higher dopant concentration for each individual bit than the dopant concentration implanted for the 1 cell 1 bit type of storage in order to operate the memory cell.

To operate the memory cell A of the above 1 cell 2 bit mask ROM device, a high voltage must be applied to the gate of memory cell A. However, the memory cell B that is contiguous to the memory cell A but is not being operated on is connected to the memory cell A through a same bit line. Being affected by the high dopant concentration implanted in the coding region, the drain region of the memory cell B also senses the current flow, causing the memory cell B to generate a gate induced drain leakage phenomenon (GIDL) and leading to problems of device reliability.

SUMMARY OF THE INVENTION

Accordingly, the present invention provides a structure of a mask ROM device, wherein the device can store 2 bit of information in a single cell to increase the integration of the device.

The present invention also provides a structure of a mask ROM device. The device, which comprises a double diffused source/drain region, can lower the gate induced drain leakage.

The present invention further provides a mask ROM device, wherein the operation window of a 1 cell 2 bit mask ROM device is increased, while the second bit effect is decreased.

The present invention provides a mask ROM device. This device includes a substrate, a gate, a double diffused source/drain region that comprises a first doped region and a second doped region, a channel region, a coding region, a dielectric layer and a word line. The gate is disposed on the substrate. The double diffused source/drain region is located in the substrate beside the side of the gate. Moreover, the second doped region is arranged at the periphery of the first doped region. The channel region is positioned between the double diffused source/drain region. The coding region is positioned in the substrate beside the sides of the channel region near the double diffused source/drain region. The dielectric layer is disposed above the double diffused source/drain region, and the word line is disposed above the dielectric layer and the gate.

Additionally, the second doped region is connected to the periphery of the first doped region. The dopant concentration in the first doped region is higher than that in the second doped region.

According to the aforementioned mask ROM device of the present invention, each memory cell can store 2 bit of information. Therefore, the miniaturization of devices to increase the integration of devices can achieve with the existing manufacturing techniques.

Furthermore, the mask ROM device of the present invention comprises a double diffused source/drain region to buffer the high concentration coding implantation through the implanting from the lower concentration doped region at the periphery of the double diffused source/drain region. The gate induced drain leakage is thereby effectively reduced.

Since the mask ROM device of the present invention can effectively lower the gate induced drain leakage, the operation window of a 1 cell 2 bit mask ROM memory device is increased while the second bit effect is mitigated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A to 1G are schematic, cross-sectional views illustrating the fabrication process of a mask ROM device according to one preferred embodiment of the present invention.

Figure 1A:
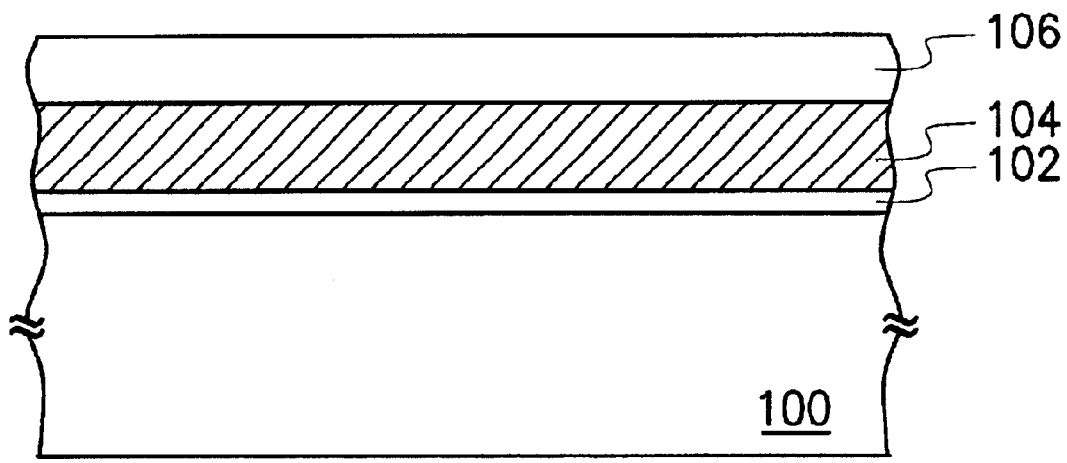
FIGS. 1A to 1G are schematic, cross-sectional views illustrating the fabrication process of a mask ROM device according to one preferred embodiment of the present invention.

As shown in FIG. 1A, a substrate 100 is provided. The substrate 100 comprises a gate dielectric layer 102, a conductive layer 104 and a cap layer 106 sequentially formed thereon. The gate dielectric layer 102, such as silicon oxide, is formed by, for example, thermal oxidation. The conductive layer 104, which includes polysilicon type of material, is formed by, for example, chemical vapor deposition (CVD). The cap layer 106, such as, silicon nitride, is formed by a method includes chemical vapor deposition.

Figure 1B:
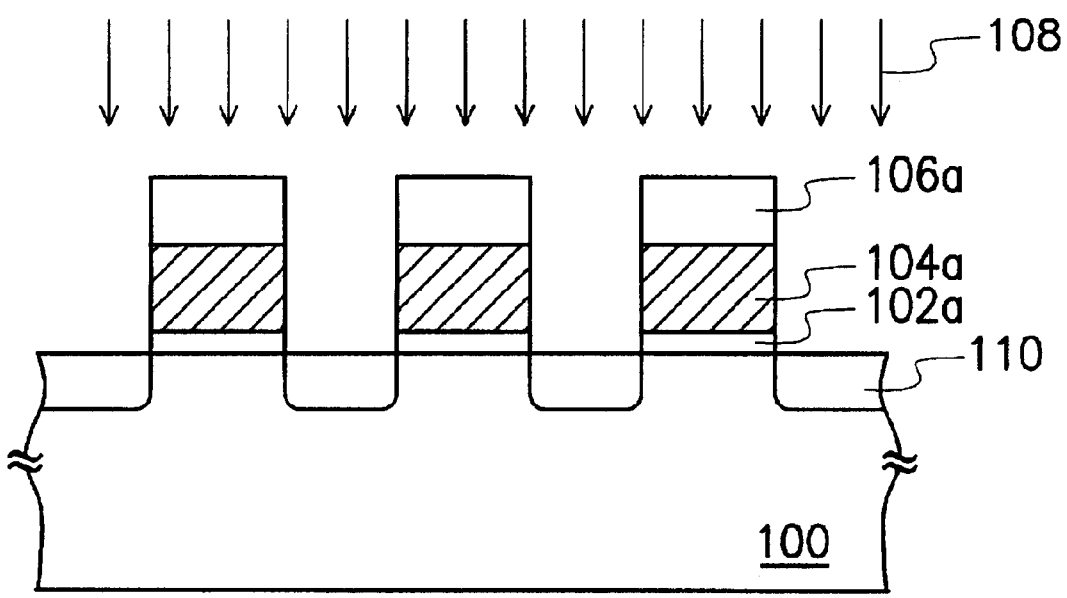

As shown in FIG. 1B, the cap layer 106, the conductive layer 104 and the gate dielectric layer 102 are then patterned by means of photolithography and etching to form a plurality of conductive bars 104a that comprise cap layers 106a and gate dielectric layers 102a. An annealing is then performed to form a plurality of denser conductive bars 104a. The annealing is conducted at a temperature of about 900 degrees Celsius to about 1100 degrees Celsius.

An ion implantation process 108 is then conducted to form a doped region 110 in the substrate 100 between the conductive bars 104a using the conductive bars 104a with the cap layers 106a thereon as a mask. The dopants used in the implantation process 108 include the N type arsenic ions. The implantation energy is about 10 to 50 Kev and the implanted dosage is about $0.5 \times 10^{15}$ to $2 \times 10^{15}/cm^3$.

Figure 1C:
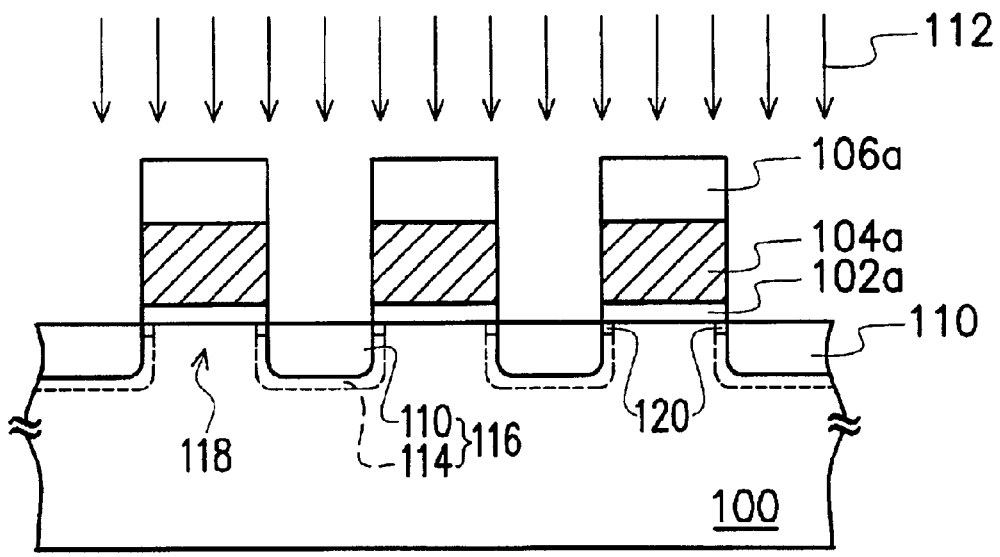

Continuing to FIG. 1C, still using the conductive bars 104a with the cap layers 106a thereon as a mask, an ion implantation process 112 is conducted to form a doped region 114 in the substrate 100 between the conductive bars 104a. The dopants used in the implantation process 112 include the N type arsenic ions. The implantation energy is about 20 to 100 Kev and the implanted dosage is about $0.5 \times 10^{15}$ to $2 \times 10^{15}/cm^3$. The dopants for the implantation process 112 also include the N type phosphorous ions. The implantation energy for the N type phosphorous ions is about 10 to 50 Kev and the implanted dosage is about $0.5 \times 10^{15}$ to $2 \times 10^{15}/cm^3$.

A rapid thermal annealing is then conducted to evenly distribute the dopants in the substrate 100 and to transform the doped region 110 and the doped region 114 to a double diffused source/drain region 116. Between the double diffused source/drain regions 116 is defined as the channel region 118.

Since the mask ROM device of the present invention is pre-determined to be a 1 cell 2 bit type of memory device, the intersection between the channel region 118 and the double diffused source/drain region 116 is defined as the coding region 120.

Figure 1D:
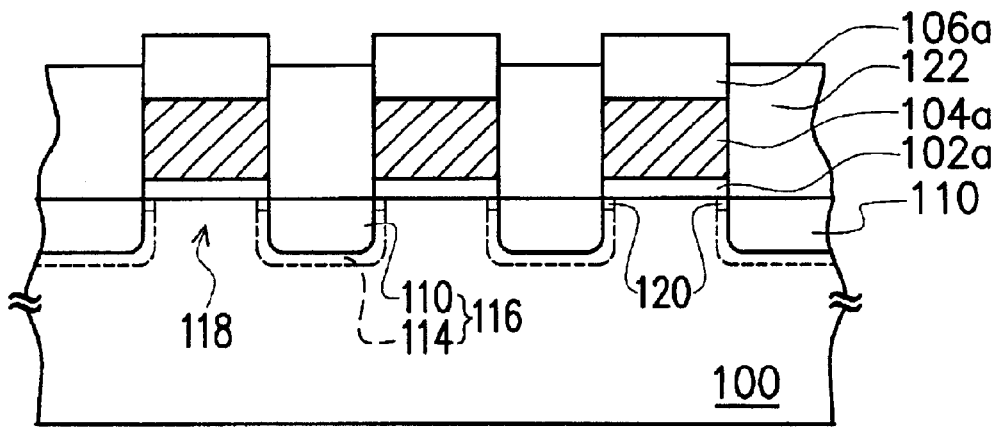

Referring to FIG. 1D, a dielectric layer 122 is filled between the conductive bars 104a and the cap layers 106a, wherein the surface of the dielectric layer 122 is lower than the surface of the cap layers 106a. The dielectric layer 122 is, for example, silicon oxide. The dielectric layer 122 is formed by, for example, covering the substrate 100 with a material layer, followed by performing a back-etching such that the surface of the material layer is lower than the surface of the cap layer 106a to form the dielectric layer 122.

Figure 1E:
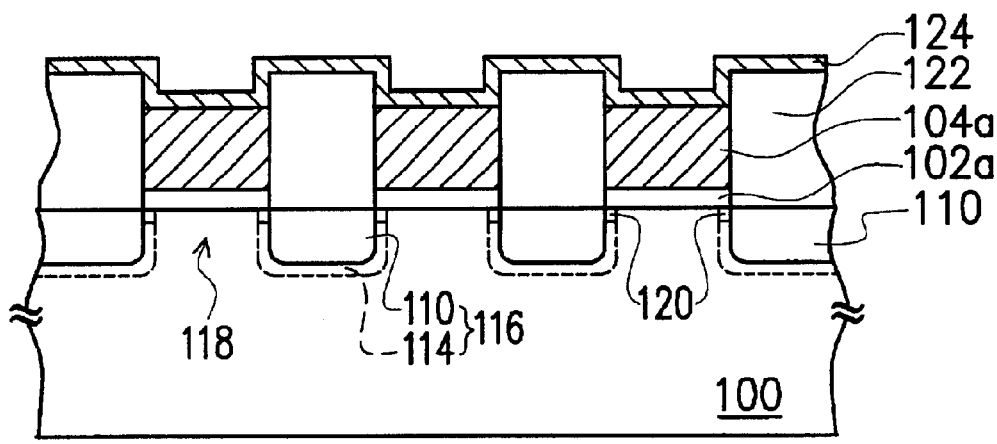

Referring to FIG. 1E, the cap layer 106a is removed to expose the surface of the conductive bar 104a, wherein removing the cap layer 106a includes dry etching or wet etching. A conductive layer 124 is then formed on the substrate 100. This conductive layer 124 is, for example, polysilicon. The conductive bar 104a and the conductive layer 124 are concurrently patterned to form a word line and a gate.

Figure 1F:
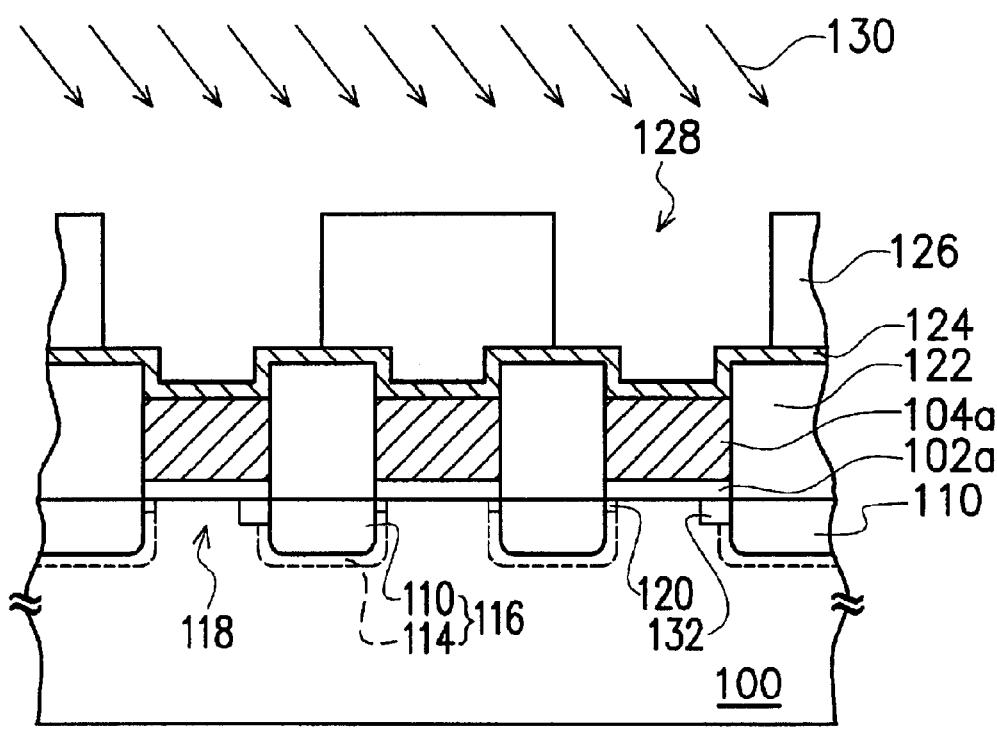

Referring to FIG. 1F, A patterned photoresist 126 is formed on the substrate 100 as a coding mask. The patterned photoresist 126 comprises an opening 128. A tilt-angle ion implantation process 130 is then conducted on one side of the coding region 120 (for example, the coding region on the right side of the channel region 118). A plurality of coding doped regions 132 is thus formed in the coding region 120 in the substrate 100 to program the ROM device. The tilt-angle ion implantation process 130 uses p-type dopants, such as, boron. The tilt-angle ion implantation process 130 is performed with a dosage of about $0.5 \times 10^{14}$ to $5 \times 10^{14}/cm^3$ and an energy of about 80 to 180 Kev, and at a tilt angle of about 15 to 60 degrees Celsius. The tilt-angle ion implantation process 130 can also uses the p-type dopants, such as, $BF_2$ ions, and is performed with a dosage of about $0.5 \times 10^{14}$ to $5 \times 10^{14}/cm^3$ and an energy of about 15 to 50 Kev, and at a tilt angle of about 15 to 60 degrees Celsius.

Figure 1G:
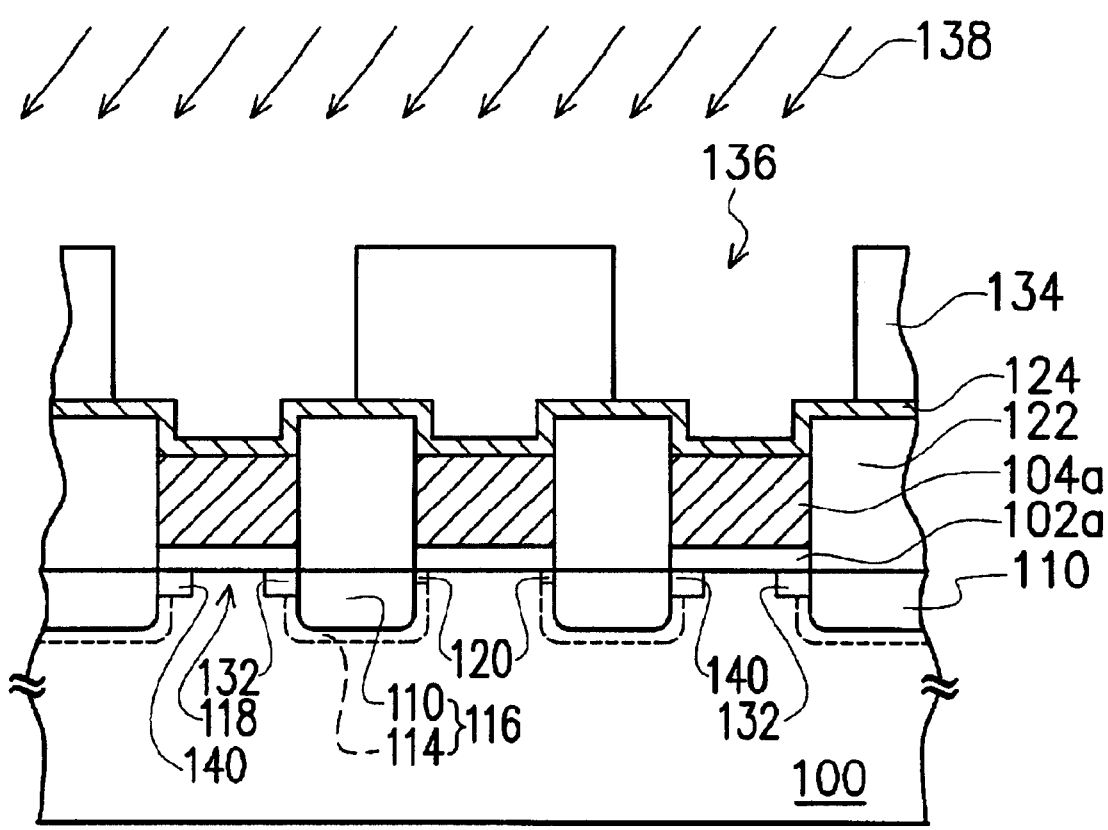

Continuing to FIG. 1G, subsequent to the removal of the photoresist layer 126, another patterned photoresist layer 134 is formed on the substrate 100 as the coding mask. The patterned photoresist layer 134 comprises an opening 136. A tilt-angle ion implantation process 138 is then conducted on another side of the coding region 120 (for example, the coding region on the left side of the channel region 118). A plurality of coding doped regions 140 is thus formed in the coding region 120 in the substrate 100 to program the ROM device. The tilt-angle ion implantation process 138 uses p-type dopants, such as, boron. The tilt-angle ion implantation process 138 can perform with a dosage of about $0.5 \times 10^{14}$ to $5 \times 10^{14}/cm^3$ and an energy of about 80 to 180 Kev, and at a tilt angle of about 15 to 60 degrees Celsius. The tilt-angle ion implantation process 138 can also uses the p-type dopants, such as, $BF_2$ ions, and is performed with a dosage of about $0.5 \times 10^{14}$ to $5 \times 10^{14}/cm^3$ and an energy of about 15 to 50 Kev, and at a tilt angle of about 15 to 60 degrees Celsius.

Still referring to FIG. 1G, FIG. 1G illustrates the structure of the mask ROM device formed according to the present invention. The mask ROM structure of the present invention comprises a substrate 100, a gate structure 104a, a double diffused source/drain region 116, a channel region 118, a coding region 120, a dielectric layer 122 and a word line.

The substrate 100 is a P-type semiconductor substrate, such as a silicon substrate.

The gate is disposed on the substrate 100, wherein a material for the gate is, for example, polysilicon, and the gate is formed with the patterned conductive bars 104a.

The double diffused source/drain region 116 comprises the doped region 110 and the doped region 114, wherein the doped region 110 and the doped region 114 are implanted with the N-type arsenic ions. The doped region 114 is disposed on the substrate 100 at the peripheral of the doped region 110, and is connected to the doped region 114. In other words, the doped region 110 and the doped region 114 are at different depths. Moreover, the dopant concentration in the doped region 114 is lower than that in the doped region 110.

The channel region 118 is positioned in the substrate 100 between the double diffused source/drain regions 116.

The coding region 120 is located in the substrate 100 at the intersection between the sides of the channel region 118 and the double diffused region 116.

The dielectric layer 122 is disposed on the double diffused source/drain region 116. The dielectric layer 122 includes, for example, silicon oxide.

The word line is positioned above the gate and the dielectric layer 122, wherein the word line is formed with the patterned conductive layer 124. The gate and the substrate 100 further comprises a gate dielectric layer 102a, wherein the gate dielectric layer 102a is, for example, silicon oxide, of about 20 to 100 angstroms.

Figure 2:
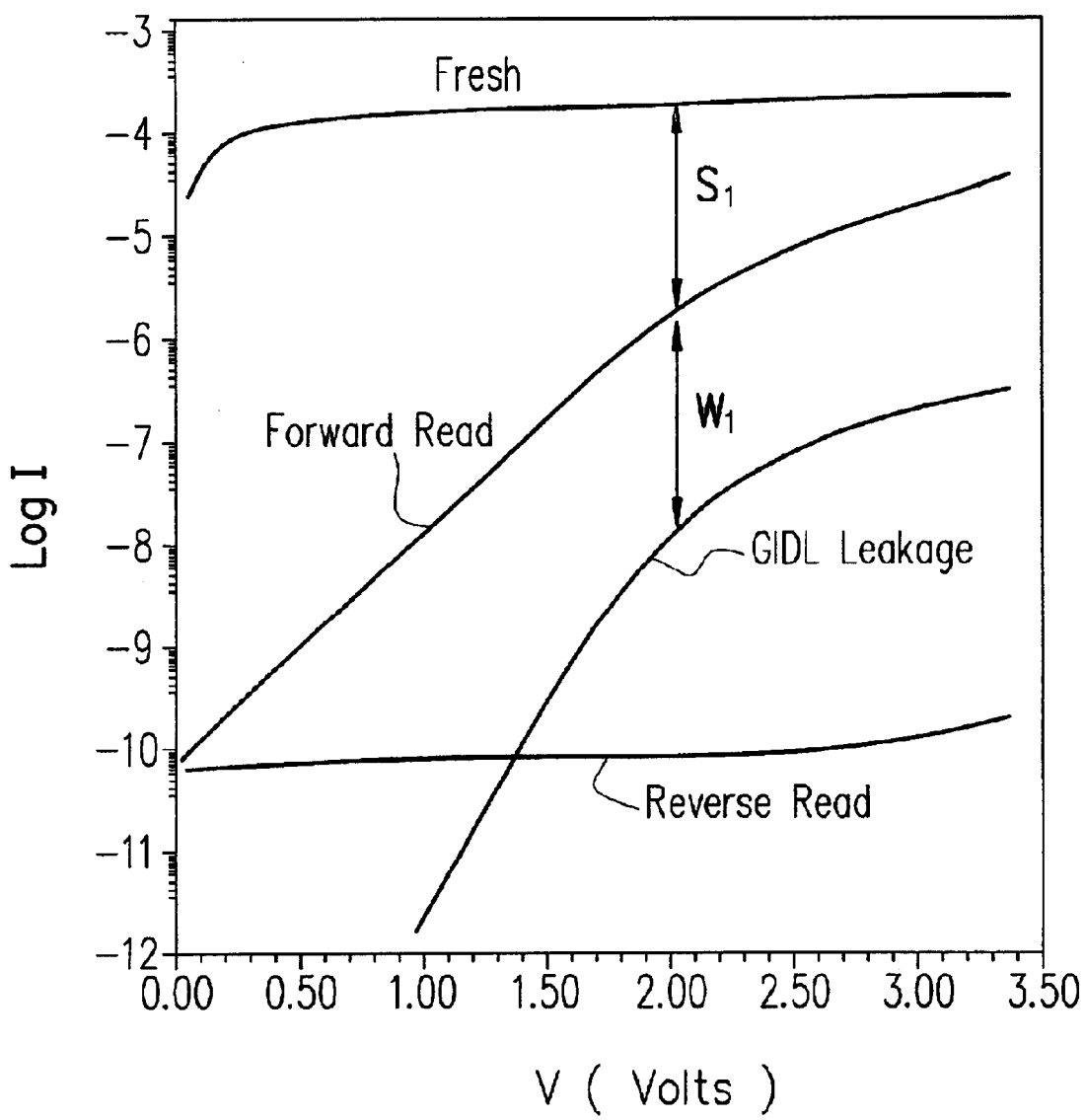
FIG. 2 is a diagram illustrating the functional relationship between the current and the operational voltage of a 1 cell 2 bit memory cell of a single diffused source/drain mask ROM device.

Referring to FIG. 2, FIG. 2 is a diagram illustrating the functional relationship between the current and the operational voltage of a 1 cell 2 bit memory cell of a single diffused source/drain mask ROM device. The X-axis in FIG. 2 represents the voltage (in volts) and the Y-axis represents the log of current (in log I). Moreover, the coding implantation for this mask ROM device (not shown) is conducted from one side only. The reading of the memory cell before implanting from the one side is defined as forward reading, and the forward reading corresponds to an "off" state. Conversely, the reading of the memory cell after implanting from the other side is known as reverse reading, and reverse reading corresponds to an "on" state.

As shown in FIG. 2, the current flow induced by the drain of a single diffused source/drain mask ROM device is between the forward reading current and the reverse reading current. Therefore, the drain-induced current leakage may misinterpret as the forward reading current flow. In order to avoid the above situation, the operational current has to be higher than the drain induced current flow value. The device operation margin is thus lowered (the distance W1 in FIG. 2).

Figure 3:
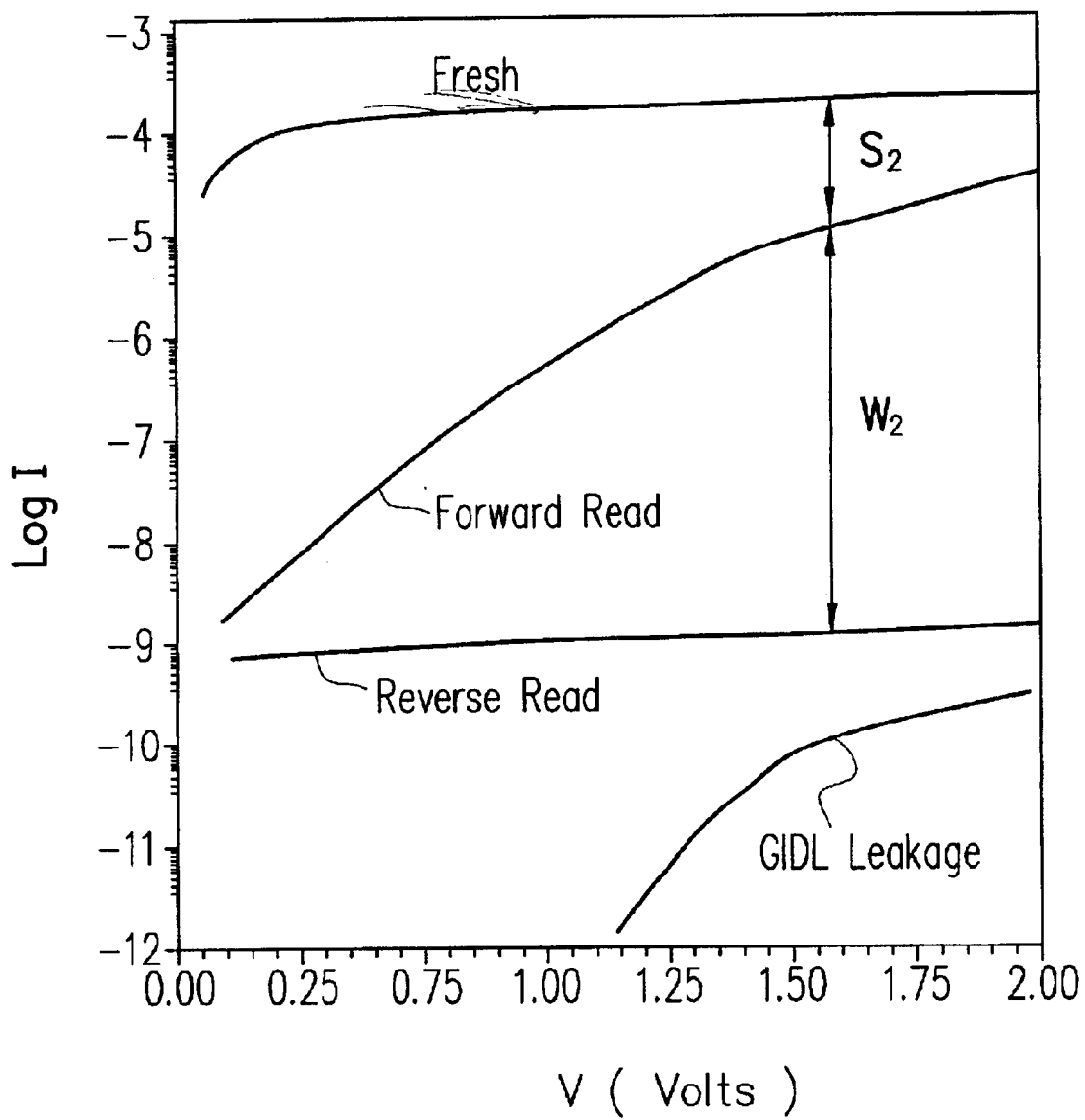
FIG. 3 is a diagram illustrating the functional relationship between the current and the operational voltage of a 1 cell 2 bit memory cell of a double diffused source/drain mask ROM device.

Referring to FIG. 3, FIG. 3 is a diagram illustrating the functional relationship between the current and the operational voltage of a 1 cell 2 bit memory cell of a double diffused source/drain mask ROM device. The axes in FIG. 3 are same as those in FIG. 2. Moreover, the programming position and operation in FIG. 3 are same as those in FIG. 2. As shown in FIG. 3, the drain induced current leakage of the double diffused source/drain mask ROM is lower than the reverse reading current flow value. Therefore, misinterpreting the drain induced current leakage as the forward reading does not occur easily. In other words, the operation margin is higher. Comparing FIG. 2 with FIG. 3, the distance S2 between the fresh current value (for example, the reading current of a 1-bit-1-cell type of memory cell, in other words, wherein coding implantation is absent) and the forward reading current value in FIG. 3 is less than the distance S1 in FIG. 2. Accordingly, the present invention provides a smaller 2 bit effect.

Based on the foregoing, every memory cell of the mask ROM device of the present invention can store two bit of information. The miniaturizing of devices to increase the integration of devices can achieve with the existing processing techniques Moreover, the mask ROM device of the present invention comprises a double diffused source/drain region to buffer the high concentration coding implantation through implanting from the lower concentration doped region at the periphery of the double diffused source/drain region. The gate induced drain leakage is thus effectively reduced.

Moreover, since the mask ROM device of the present invention can effectively lower the gate induced drain leakage, the operation margin of the 1 cell 2 bit mask ROM device is increased while the second bit effect is mitigated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask read-only memory (ROM) device, the device comprising:
   a substrate;
   a gate, disposed on the substrate;
   a double diffused source/drain region located in the substrate beside the gate, wherein the double diffused source/drain region comprises a first doped region and a second doped region that are at different depths, are comprised of dopants of same conductivity type and have different dopant concentrations;
   a channel region, positioned between the double diffused region in the substrate;
   a coding region, located in the substrate at the intersection between sides of the channel region and the double diffused source/drain region;
   a dielectric layer, disposed on the double diffused source/drain region; and
   a word line, disposed on the dielectric layer and the gate.

2. The device of claim 1, wherein the second doped region is arranged in the substrate at the periphery of the first doped region, and the second doped region is connected to the periphery of the first doped region.

3. The device of claim 1, wherein a dopant concentration of the first doped region is higher than that of the second doped region.

4. The device of claim 1, wherein the double diffused source/drain region includes an N-type doped region implanted with arsenic or phosphorous ions.

5. The device of claim 1, wherein between the gate and the substrate further includes a gate dielectric layer.

6. A mask ROM device, the device comprising:
   a substrate;
   a gate, disposed on the substrate;
   a first doped region, located in the substrate beside the sides of the gate;
   a second doped region, located in the substrate at a periphery of the first doped region, wherein the second doped region is connected to the periphery of the first doped region, and a dopant concentration of the second doped region is lower than that of the first doped region, and wherein the first doped region and the second doped region include dopants of same conductivity type;
   a channel region, positioned between the first doped region and another first doped region in the substrate;
   a coding region, located at the intersection between sides of the channel region and the first doped region;
   a dielectric layer, disposed above the first doped region; and
   a word line, disposed above the dielectric layer and the gate.

7. The device of claim 6, wherein the first doped region includes an N-type doped region implanted with arsenic or phosphorous ions.

8. The device of claim 6, wherein the second doped region includes an N-type doped region implanted with arsenic or phosphorous ions.

9. The device of claim 6, wherein between the gate and the substrate further comprises a gate dielectric layer.

* * * * *